US012782456B2

(12) United States Patent
Maruchi et al.

(10) Patent No.: US 12,782,456 B2
(45) Date of Patent: Nov. 3, 2026

(54) INFORMATION PROCESSING APPARATUS, INFORMATION PROCESSING METHOD, INFORMATION PROCESSING SYSTEM, AND NON-TRANSITORY COMPUTER READABLE MEDIUM

(71) Applicant: KABUSHIKI KAISHA TOSHIBA, Tokyo (JP)

(72) Inventors: Kohei Maruchi, Tokyo (JP); Takahiro Yamamoto, Tokyo (JP); Hisaaki Hatano, Yokohama (JP)

(73) Assignee: KABUSHIKI KAISHA TOSHIBA, Kawasaki (JP)

( * ) Notice: Subject to any disclaimer, the term of this patent is extended or adjusted under 35 U.S.C. 154(b) by 433 days.

(21) Appl. No.: 18/549,615

(22) Filed: Sep. 8, 2023

(65) Prior Publication Data

US 2025/0355054 A1 Nov. 20, 2025

Related U.S. Application Data

(63) Continuation of application No. PCT/JP2022/012825, filed on Mar. 18, 2022.

(51) Int. Cl.
*G01R 31/392* (2019.01)
*G01R 31/3835* (2019.01)

(52) U.S. Cl.
CPC ....... *G01R 31/392* (2019.01); *G01R 31/3835* (2019.01)

(58) Field of Classification Search
CPC .... G01R 31/392; G01R 31/3835; B06L 58/12
See application file for complete search history.

(56) References Cited

U.S. PATENT DOCUMENTS

| | | | |
|---|---|---|---|
| 10,372,183 B2 | 8/2019 | Yamamoto et al. | |
| 11,300,625 B2 | 4/2022 | Yamamoto et al. | |
| 2017/0031404 A1 | 2/2017 | Yamamoto et al. | |
| 2021/0178927 A1 * | 6/2021 | Yamamoto .............. | B60L 58/12 |
| 2021/0405120 A1 | 12/2021 | Hatano et al. | |

FOREIGN PATENT DOCUMENTS

| | | |
|---|---|---|
| JP | 2017-194468 A | 10/2017 |
| JP | 6313502 B2 | 4/2018 |
| JP | 2020-119712 A | 8/2020 |
| WO | WO-2021/044635 A1 | 3/2021 |

OTHER PUBLICATIONS

European Patent Office, Extended European Search Report in EP App. No. 22929199.2 (Nov. 3, 2025).

* cited by examiner

*Primary Examiner* — Lam S Nguyen
(74) *Attorney, Agent, or Firm* — Finnegan, Henderson, Farabow, Garrett & Dunner, LLP

(57) ABSTRACT

According to one embodiment, an information processing apparatus includes processing circuitry configured to acquire measurement data including a plurality of amounts of charge and a plurality of voltage values in a target rechargeable battery; calculate, based on the measurement data, a first feature related to a range of the voltage values with respect to the amounts of charge and a second feature related to a change of the voltage values with respect to the amounts of charge; and estimate a state of the target rechargeable battery based on the first feature and the second feature.

19 Claims, 14 Drawing Sheets

| BATTERY ID | TIME OF DAY | VOLTAGE | SoC | POWER | TEMPERATURE | ·· |
|---|---|---|---|---|---|---|
| BATTERY 1 | 2018/3/10 10:00:00 | 30.3 | 80.5 | 1280 | 25.2 | ·· |
| BATTERY 1 | 2018/3/10 10:00:01 | 30.1 | 80.3 | 1280 | 25.2 | ·· |
| BATTERY 1 | 2018/3/10 10:00:02 | 30.1 | 80.2 | 1281 | 25.3 | ·· |
| BATTERY 1 | 2018/3/10 10:00:03 | 30.2 | 80.0 | 1282 | 25.3 | ·· |
| : | : | : | : | : | : | ·· |
| BATTERY 2 | 2017/1/1 00:00:01 | 31.3 | 60.5 | 1380 | 20.2 | ·· |
| BATTERY 2 | 2017/1/1 00:00:02 | 31.5 | 61.0 | 1379 | 20.1 | ·· |
| BATTERY 2 | 2017/1/1 00:00:03 | 31.5 | 61.5 | 1378 | 20.2 | ·· |
| : | : | : | : | : | : | ·· |
| BATTERY N | 2019/2/1 09:00:00 | 32.5 | 70.5 | 1580 | 29.2 | ·· |
| : | : | : | : | : | : | ·· |
| : | : | : | : | : | : | ·· |

FIG. 4

| BATTERY ID | MEASUREMENT CLOCK TIME | SoH |
|---|---|---|
| BATTERY 1 | 2018/3/10 11:00:00 | 90.3 |
| BATTERY 1 | 2018/3/11 11:01:11 | 90.2 |
| BATTERY 1 | 2018/3/12 11:02:02 | 90.0 |
| BATTERY 1 | 2018/3/13 11:00:03 | 89.8 |
| : | : | : |
| BATTERY 2 | 2017/1/1 10:00:01 | 81.3 |
| BATTERY 2 | 2017/1/2 10:30:02 | 81.0 |
| BATTERY 2 | 2017/1/3 10:25:03 | 81.0 |
| : | : | : |
| BATTERY N | 2019/2/1 12:00:00 | 72.5 |
| : | : | : |
| : | : | : |

FIG. 5

| BATTERY ID | TIME OF DAY | VOLTAGE | SoC | POWER | TEMPERATURE | ·· | SoH |
|---|---|---|---|---|---|---|---|
| BATTERY 1 | 2018/3/10 10:00:00 | 30.3 | 80.5 | 1280 | 25.2 | ·· | 90.3 |
| BATTERY 1 | 2018/3/10 10:00:01 | 30.1 | 80.3 | 1280 | 25.2 | ·· | 90.3 |
| BATTERY 1 | 2018/3/10 10:00:02 | 30.1 | 80.2 | 1281 | 25.3 | ·· | 90.3 |
| BATTERY 1 | 2018/3/10 10:00:03 | 30.2 | 80.0 | 1282 | 25.3 | ·· | 90.3 |
| : | : | : | : | : | : | ·· | |
| BATTERY 2 | 2017/1/1 00:00:01 | 31.3 | 60.5 | 1380 | 20.2 | ·· | 81.3 |
| BATTERY 2 | 2017/1/1 00:00:02 | 31.5 | 61.0 | 1379 | 20.1 | ·· | 81.3 |
| BATTERY 2 | 2017/1/1 00:00:03 | 31.5 | 61.5 | 1378 | 20.2 | ·· | 81.3 |
| : | : | : | : | : | : | ·· | |
| BATTERY N | 2019/2/1 09:00:00 | 32.5 | 70.5 | 1580 | 29.2 | ·· | 72.5 |
| : | : | : | : | : | : | ·· | |
| : | : | : | : | : | : | ·· | |

FIG. 7

INFORMATION PROCESSING APPARATUS, INFORMATION PROCESSING METHOD, INFORMATION PROCESSING SYSTEM, AND NON-TRANSITORY COMPUTER READABLE MEDIUM

CROSS REFERENCE TO RELATED APPLICATIONS

This application is a Continuation of International Application No. PCT/JP2022/012825, filed on Mar. 18, 2022, the entire contents of which are incorporated herein by reference.

FIELD

Embodiments described herein relate to an information processing apparatus, an information processing method, an information processing system, and a non-transitory computer readable medium.

BACKGROUND

A number of cases where a rechargeable battery is used has been increased for a purpose of stabilization of an electric power system, reduction of exhaust gas, and the like towards decarbonization. A deterioration of the rechargeable battery gradually progresses according to a use frequency or an hour of use even when the rechargeable battery normally operates. To avoid a sudden malfunction of the rechargeable battery, the degree of progress of deterioration (state of health) needs to be monitored as a state of the rechargeable battery.

A technique of determining the state of health of the rechargeable battery includes a technique of using data (for example, the voltage, the amount of charge, and the like) of the rechargeable battery which is obtained when the rechargeable battery is charged and discharged in a special charge and discharge pattern. In addition, a technique of calculating the state of health of the rechargeable battery by an approximation formula (Arrhenius approximation formula) from the number of charge and discharge cycles performed so far on the rechargeable battery or the like has been proposed. Furthermore, a technique of determining the state of health of the rechargeable battery from data (for example, the voltage, the amount of charge, and the like) which is obtained from the rechargeable battery when the rechargeable battery normally operates has also been proposed.

Any of the techniques is a technique appropriate to a specific type of a deterioration such as a cycle deterioration or a storage deterioration. However, a plurality of types of deteriorations may occur in combination depending on a use mode of the rechargeable battery. In this case, it is not possible for any of the techniques described above to correctly evaluate the state of health of the rechargeable battery.

BRIEF DESCRIPTION OF THE DRAWINGS

FIG. 4 illustrates an example of a work DB;

FIG. 5 illustrates an example of a state of health DB;

FIG. 7 illustrates an example of a learn DB;

DETAILED DESCRIPTION

According to one embodiment, an information processing apparatus includes processing circuitry configured to acquire measurement data including a plurality of amounts of charge and a plurality of voltage values in a target rechargeable battery; calculate, based on the measurement data, a first feature related to a range of the voltage values with respect to the amounts of charge and a second feature related to a change of the voltage values with respect to the amounts of charge; and estimate a state of the target rechargeable battery based on the first feature and the second feature.

Hereinafter, embodiments of the present invention will be described with reference to the drawings.

Figure 1:
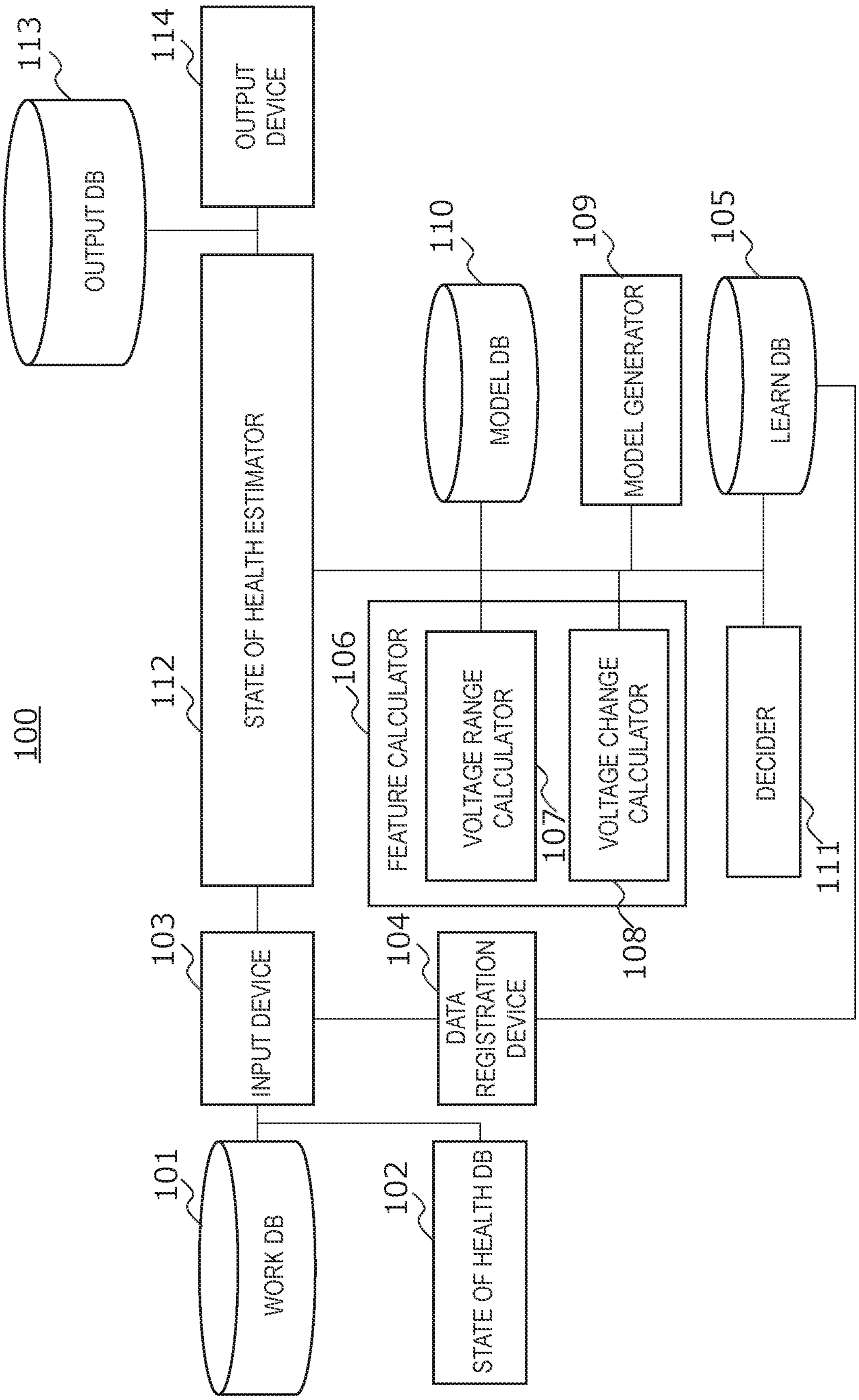
FIG. 1 is a block diagram of an example of a rechargeable battery evaluation apparatus serving as an information processing apparatus according to the present embodiment.

FIG. 1 is a block diagram of an example of a rechargeable battery evaluation apparatus 100 serving as an information processing apparatus according to the present embodiment. The rechargeable battery evaluation apparatus in FIG. 1 achieves a highly accurate estimation of a state of a rechargeable battery which may experience a plurality of types of deteriorations. The rechargeable battery is also referred to as a secondary battery, and is a battery which can repeat charge and discharge. There are a plurality of types of deteriorations in the rechargeable battery. Examples of the types of the deteriorations include a cycle deterioration, a storage deterioration, and the like. The cycle deterioration is a deterioration caused by a chemical change of a material inside the battery as charge and discharge are repeated. In the cycle deterioration, an internal resistance increases according to a progress of the deterioration. When the internal resistance has increased, the battery quickly reaches an upper limit voltage at the time of charge, and the battery quickly reaches a lower limit voltage at the time of discharge. Accordingly, a capacity of the rechargeable battery decreases in effect due to the increase of the internal resistance. On the other hand, the storage deterioration is a deterioration caused due to a retention state of the rechargeable battery. For example, when the rechargeable battery is retained in a location at a high temperature or retained in a state of being fully charged or almost fully charged or when the rechargeable battery is left in a state of being fully discharged or almost fully discharged, a decrease in the capacity quickly progresses. It is noted that the decrease in the capacity may occur in either one of a case where a potential is not applied to the rechargeable battery when the rechargeable battery is retained and a case where a potential is continuously applied to the rechargeable battery. The deterioration in a case where the potential is continuously applied to the rechargeable battery is particularly referred to as a float deterioration.

The rechargeable battery in the present embodiment will be described. The rechargeable battery is a battery which can charge and discharge. The rechargeable battery is also referred to as a secondary battery in contrast to a primary battery which can only discharge. However, a term "rechargeable battery" will be uniformly used hereinafter. When a term "charge and discharge" is used in the present embodiment, at least one of "charge" and "discharge" is included.

In an example, the rechargeable battery is a battery mounted to a movable object which operates using electrical energy as a power source, such as an electric vehicle (EV), an electric bus, a train, a light rail transit system (LRT), a bus rapid transit system (BRT), an automated guided vehicle (AGV), an airplane, or a ship. Alternatively, the rechargeable battery may be a rechargeable battery mounted to electrical equipment (such as a smartphone or a personal computer), a rechargeable battery which stores electric power for a demand response, or the like. Instead, the rechargeable battery may also be used for suppressing a frequency fluctuation in an electric power system. The rechargeable battery may also be a rechargeable battery for other intended purposes. The rechargeable battery may be used for a single intended purpose, or may also be used for a plurality of intended purposes. For example, after a rechargeable battery is used for suppressing a frequency fluctuation, the rechargeable battery may also be used for storing electric power for a power source such as an EV or a demand response by way of reuse.

Figure 2:
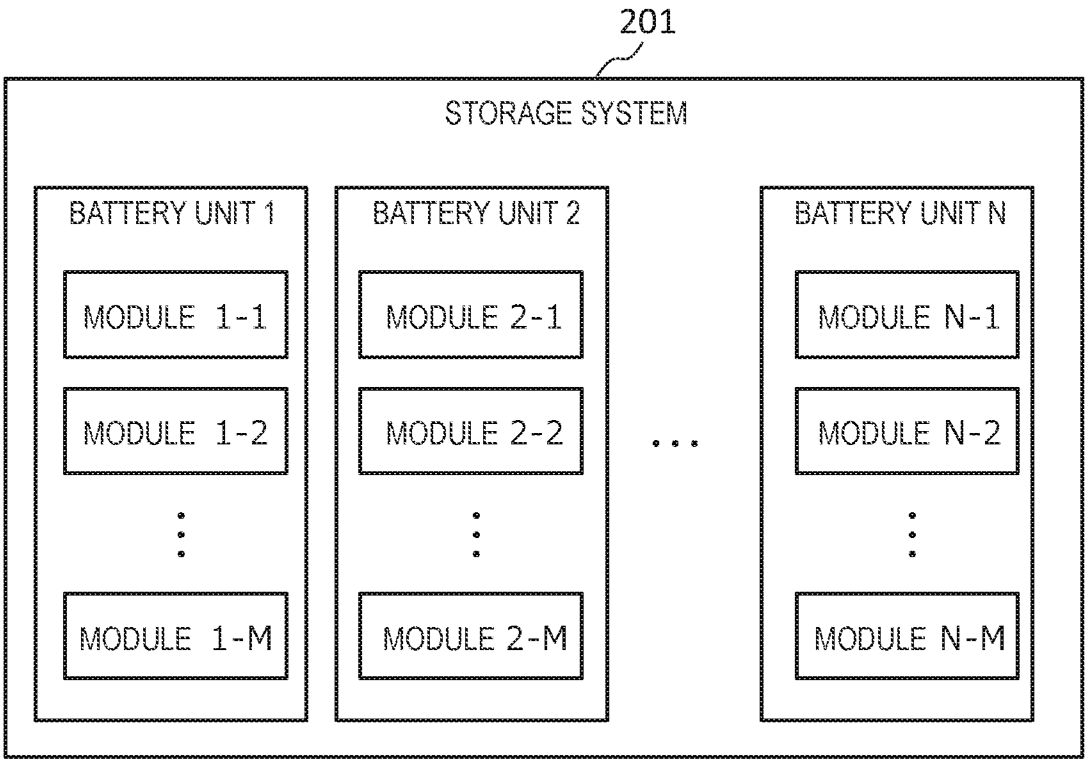
FIG. 2 illustrates a configuration example of a storage system as a mode of a rechargeable battery.

FIG. 2 illustrates a configuration example of a storage system 201 as a mode of the rechargeable battery. The storage system 201 includes battery units 1, 2, . . . N. The plurality of battery units are connected in series, connected in parallel, or connected in series and parallel such that a desired output may be obtained according to an intended purpose. Each of the battery units includes a plurality of modules. The battery unit 1 includes modules 1-1 to 1-M, the battery unit 2 includes modules 2-1 to 2-M, and the battery unit N includes modules N-1 to N-M. The plurality of modules in each of the battery units are connected in series, connected in parallel, or connected in series and parallel. In this example, the number of modules included in each of the battery units is the same, but does not necessarily need to be the same.

Figure 3:
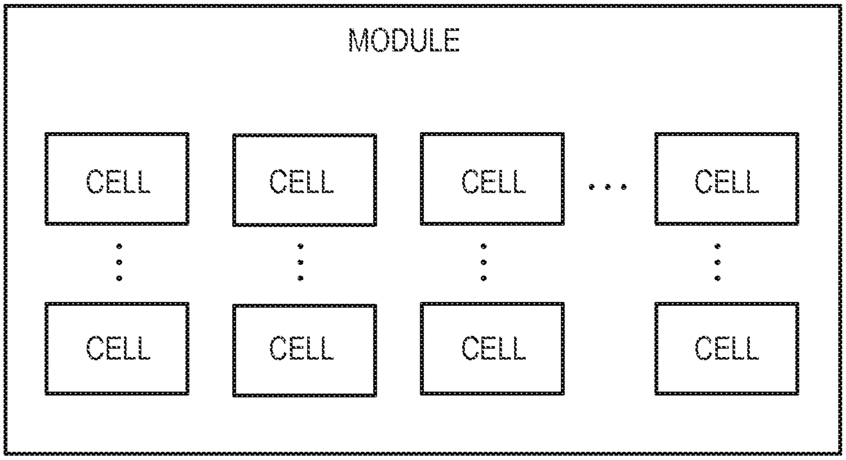
FIG. 3 illustrates a configuration example of a single module.

FIG. 3 illustrates a configuration example of a single module. The module includes a plurality of battery cells. The plurality of battery cells are connected in series, connected in parallel, or connected in series and parallel. In an example, a plurality of sets of two or more battery cells which are connected in series are connected in parallel.

A rechargeable battery (target rechargeable battery) which is set as an evaluation target in the present embodiment may be any of a cell, a module, a battery unit, and a storage system.

A work DB 101 in FIG. 1 stores work data obtained from one or a plurality of rechargeable batteries. The work data may be obtained from the currently working rechargeable battery when the rechargeable battery is used in an actual application or may be obtained from an experiment. A unit for obtainment of the work data may be any of a cell, a module, a battery unit, and a set of a plurality of battery units (storage system), or the work data may be obtained by each of a plurality of units for obtainment. In the following description, a case will be assumed where the work DB 101 stores the work data obtained in a same unit for obtainment (for example, a cell, a module, a battery unit, or a storage system) from the plurality of rechargeable batteries.

FIG. 4 illustrates an example of the work DB 101. The work data includes measurement data related to the rechargeable battery. In more detail, the work data includes a battery ID, a clock time (measurement clock time), a voltage value, a power value, a state of charge (SoC), and a temperature. The work data may include other information. For example, the work data may include a charge and discharge identifier indicating which one of charge and discharge is performed. The work data may also include other information such as an intended purpose of the rechargeable battery, a humidity, or a weather.

The work data is obtained at an interval of 1 second in the example of FIG. 4, but the obtainment interval may be another value such as 1 minute, 5 minutes, 1 hour, or the like. Instead of a constant time interval for the obtainment interval, for example, the obtainment interval may be varied according to a time slot, a use mode of the rechargeable battery, or the like. The voltage value is a charge voltage value in the case of a voltage measured at the time of charge or is a discharge voltage value in the case of a voltage measured at the time of discharge. A current value may be obtained instead of a power value, and a power value may be calculated by adding the current value and the voltage value. The SoC is an index indicating an amount of charge of the battery. The SoC may be calculated by dividing electric energy (electric charge) accumulated in the rechargeable battery by a specification capacity of the rechargeable battery. In addition, the SoC may be calculated by integrating the current value.

A state of health DB 102 stores state data including a state of the rechargeable battery which is measured with regard to at least some of the rechargeable batteries among the plurality of rechargeable batteries the work data of which is stored in the work DB 101 in FIG. 1. Specifically, the state of health DB 102 stores a state of health (SoH) or a deterioration state as a state of the rechargeable battery. For example, with regard to a rechargeable battery with a "battery ID" of 1 (which will be referred to as a "battery 1", and batteries with other IDs are also expressed according to the same description), the state of health DB 102 stores the SoH measured per unit period. As the unit period, 1 day, 1 week, 1 month, or the like may be optionally set. A length of the unit period may be varied for each of the rechargeable batteries. The state data of the rechargeable battery which is stored in the state of health DB 102 will be referred to as state of health data.

FIG. 5 illustrates an example of the state of health DB 102. An SoH is stored per day with regard to a plurality of rechargeable batteries including the batteries 1 to N. The SoH is an index indicating a state of the rechargeable battery. The state of health in the present embodiment is a ratio (%) of a battery capacity measured under a specific condition to a specification capacity. It is noted however that the SoH may be measured or calculated by another technique. In addition, a plurality of SoHs measured by a plurality of techniques may be stored in the state of health DB 102.

The SoH in the state of health DB 102 may be an SoH obtained from the rechargeable battery when the SoH is measured in the currently working rechargeable battery. In addition, when an SoH is separately calculated from the work data by a measurement device configured to measure an SoH, the SoH in the state of health DB 102 may be an SoH obtained from the measurement device.

A measurement method of the SoH may be varied for each of types of charge and discharge (charge/discharge). The types of charge and discharge include constant power charge/discharge, constant current charge/discharge, constant voltage charge/discharge, and constant current-constant voltage (CCCV) charge/discharge. For example, the measurement method of the SoH may be varied for each of constant current charge at 1 C, constant current charge at 2 C, constant current charge at 3 C, constant current discharge at 1 C, constant current discharge at 2 C, and constant current discharge at 3 C. Furthermore, the measurement method of the SoH may be varied according to at least one of charge capacity/discharge capacity and charge/discharge rates (1 C, 2 C, 3 C, and the like). It is noted that 1 C indicates a magnitude of a current required to fully charge or fully discharge the rechargeable battery in 1 hour. In addition, the rechargeable battery may be measured at a plurality of temperatures to obtain a plurality of SoHs.

Figure 6:
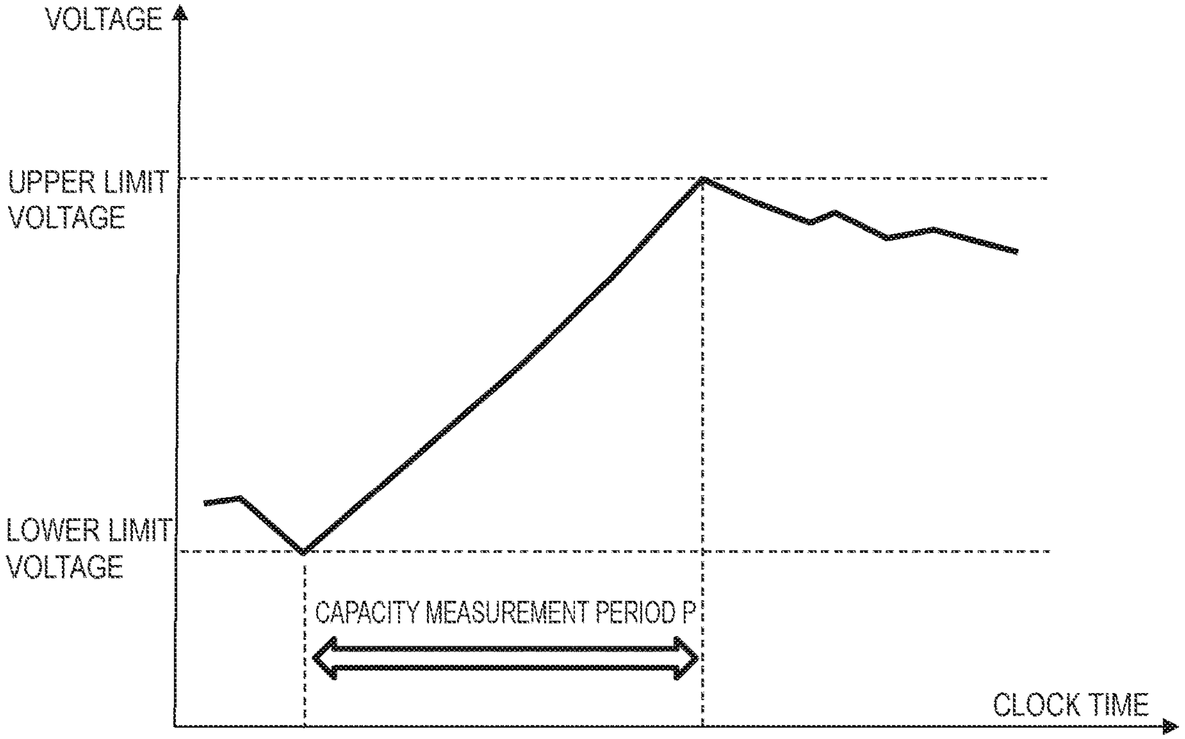
FIG. 6 illustrates an example in which a state of health (SoH) is calculated from work data.

FIG. 6 illustrates an example in which an SoH is calculated from the work data of the rechargeable battery. Pieces of data in which the voltage monotonically increases from a lower limit voltage representing a fully discharged state to an upper limit voltage representing a fully charged state are specified from the work data of the rechargeable battery. A period for the voltage to reach the upper limit voltage from the lower limit voltage corresponds to a capacity measurement period P. The detected pieces of data are set as target data used for capacity measurement. Before the detection of the target data is performed, smoothing processing may be performed on the voltage values in the work data. As an example of the smoothing processing, noise or singular values may be reduced by performing averaging processing on the voltage values by using the temporally preceding and succeeding voltage values. Electric charge (AH) charged during the capacity measurement period P is calculated by adding the current values during the capacity measurement period P based on the target data. By dividing the calculated electric charge by the specification capacity (specification value) of the rechargeable battery, the state of health (SoH) can be obtained.

An input device 103 obtains the work data from the work DB 101 and obtains state of health data from the state of health DB 102. The input device 103 may obtain the work data and the state of health data based on instruction data from a data registration device 104. The input device 103 provides the work data and the state of health data that have been obtained to the data registration device 104. An operation of providing the work data and the state of health data to the data registration device 104 is performed when learn data for estimation model generation is stored in a learn DB 105. In addition, the input device 103 obtains work data from the work DB 101 based on instruction data from a state of health estimator 112, and provides the obtained work data to the state of health estimator 112. An operation of providing the work data to the state of health estimator 112 is performed when a state of the rechargeable battery (SoH) which is set as an estimation target is estimated based on an estimation model.

The data registration device 104 obtains the work data from the work DB 101 and obtains the state of health data from the state of health DB 102 via the input device 103. The data registration device 104 associates the SoH included in the state of health data with the work data, and stores the work data with which the SoH is associated (which will be referred to as learn data) in the learn DB 105. As a method of associating the SoH with the work data, the association is performed based on a relationship between a measurement date and time of the SoH and a date and time of the work data. For example, the SoH may be associated with the work data on the same date as the measurement date of the SoH. Alternatively, the SoH may be associated with the work data in which the clock time is included in a certain range (for example, within 24 hours) by setting the measurement date and time of the SoH as a reference. The certain range is not limited to 24 hours, and may be 3 days, 1 week, 1 month, or the like.

When the learn data is to be registered, in a case where the unit for obtainment varies such as the voltages in the work data of each of the rechargeable batteries, values such as the voltages may be unified in conformity to a specific unit for obtainment. For example, values of voltages and currents in the work data of each of the rechargeable batteries may be unified to values of voltages and currents in the unit of cells. For example, when the voltage values in the unit of modules or the like are converted into the voltage values in the unit of cells or the like, the voltage values or the like after the conversion can be calculated based on a connection structure of the cells in the module (see FIG. 3).

FIG. 7 illustrates an example of the learn DB 105. The SoH illustrated in FIG. 5 is associated with data on the same date in the work data illustrated in FIG. 4. For example, in the case of the battery 1, data on 2018 Mar. 10 is all associated with 90.3 of the SoH measured at 11:00:00 on 2018 Mar. 10.

A model generator 109 generates a model configured to estimate an SoH that is a state of the rechargeable battery based on the learn data (the work data and the SoH) in the learn DB 105. A type of a model and a type of a feature used as an input variable (explanatory variable) of the model may be designated in advance. Alternatively, the model generator 109 may decide at least one of the type of the model and the type of the feature according to a previously decided algorithm based on the learn data. Alternatively, a user of this apparatus may input instruction data for an instruction of at least one of the type of the model and the type of the feature to the model generator 109 by using an input interface. In this case, the model generator 109 may decide at least one of the type of the model and the type of the feature based on the instruction data.

The model generator 109 calculates a plurality of features for each of the rechargeable batteries by using a feature calculator 106 based on the work data in the learn data. In this example, as the plurality of features, the model generator 109 calculates a feature related to a range of voltage values (voltage range) with respect to the amount of charge (SoC), and a feature related to a change of the voltage values (voltage change) with respect to the amount of charge (SoC). Examples of the feature (voltage range feature) related to the range of the voltage values with respect to the SoC include a distribution of the voltage values or a spread of the voltage values with respect to the SoC. In addition, examples of the feature (voltage change feature) related to the change of the voltage values with respect to the SoC include a slope of the voltage values (voltage slope) with respect to the SoC. The feature calculator 106 includes a voltage range calculator 107 configured to calculate a feature (first feature) related to a range of the voltage values with respect to the SoC, and a voltage change calculator 108 configured to calculate a feature (second feature) related to a change of the voltage values.

Calculation Method of Feature Related to Voltage Range

In an example, the feature related to the voltage range is a range of the voltage values in a specific SoC range in a case where the voltage values of the work data and the SoCs are plotted to a coordinate system in which a vertical axis represents a voltage and a horizontal axis represents an SoC. Specifically, the feature related to the voltage range is a standard deviation (dispersion) of the voltage values in the specific SoC range. A plurality of SoC ranges may be designated, and the standard deviation of the voltage values may be calculated for each of the designated ranges. That is, a plurality of features related to the voltage range may be calculated.

Another example of the feature related to the voltage range is a difference between a voltage at the time of charge and a voltage at the time of discharge. An SoC or an SoC range for calculating a voltage difference may be designated in advance, a difference between a representative value of the voltages at the time of charge at the SoC or in the SoC range and a representative value of the voltages at the time of discharge in the SoC may be calculated. The representative value is, for example, a mean value, a maximum value, a minimum value, a median value, or the like. A plurality of SoCs or SoC ranges may be designated, and a feature may be calculated for each of the SoCs or SoC ranges. That is, a plurality of features related to the voltage range may be calculated. A voltage at the time of regeneration when power of regenerative braking or the like is regenerated in an apparatus to which the rechargeable battery is mounted may be used instead of the voltage at the time of discharge. In addition, a voltage at the time of work may be used instead of the voltage at the time of discharge.

Figure 8:
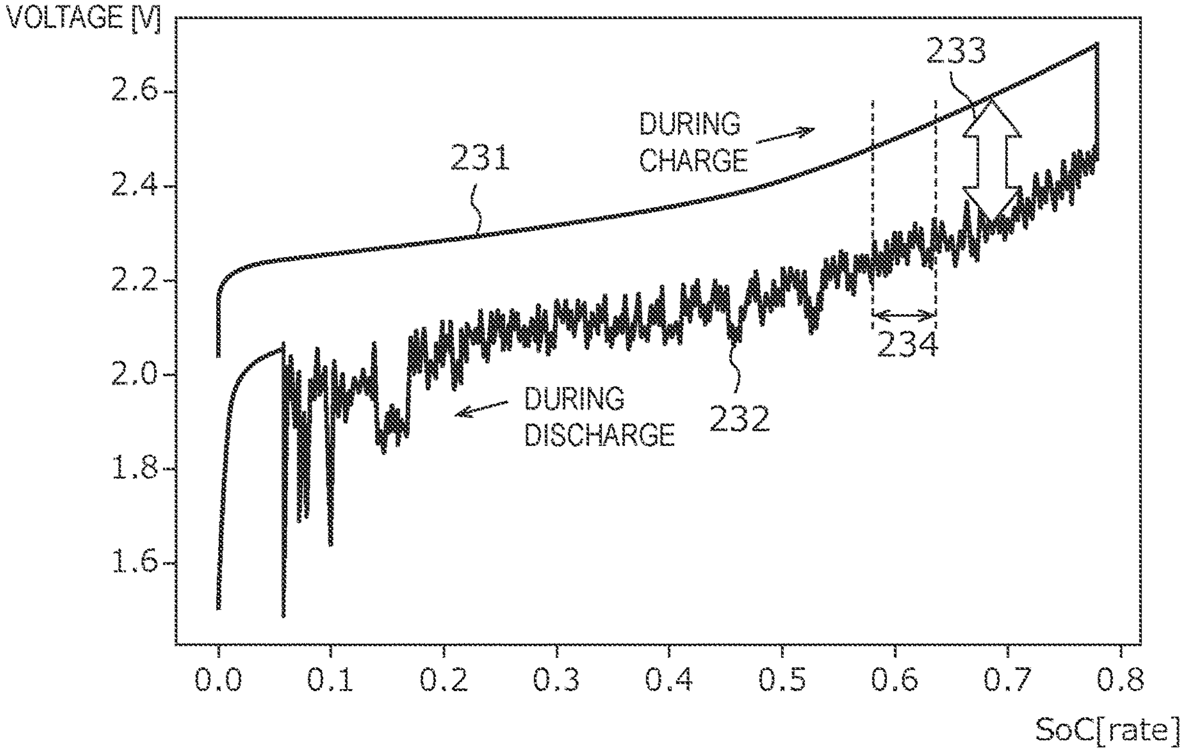
FIG. 8 illustrates an example in which a feature related to a voltage distribution is calculated.

FIG. 8 illustrates an example in which the feature related to the voltage range is calculated. In the work data used in this example, charge is started when the SoC is close to 0, and charge continues until the SoC becomes close to 0.8. Thereafter, discharge is started, and discharge is then stopped when the SoC is close to 0. A graph 231 represents a transition of a charge voltage at this time. A graph 232 represents a transition of a discharge voltage. A horizontal axis represents an SoC, and a vertical axis represents a voltage. A difference 233 between the charge voltage and the discharge voltage in a same SoC is an example of the feature related to the voltage distribution. In another example, a standard deviation of the voltage values included in an SoC range (segment) 234 is the feature related to the voltage distribution. In still another example, a difference between a first voltage value (a representative value of the charge voltages such as, for example, a mean value) based on charge voltage values included in the SoC range 234 and a second voltage value (for example, a representative value of the discharge voltages, such as, for example, a mean value) based on discharge voltage values included in the SoC range 234 is the feature related to the voltage distribution. A plurality of SoC ranges may be set, and the feature may be calculated for each of the ranges.

Calculation Method of Feature Related to Voltage Change

In an example, a slope (voltage slope) of the voltage values with respect to the SoC can be obtained by linearly regressing the voltage from the SoC based on the work data.

A feature related to a change in the voltage values (such as a voltage slope) may be calculated by selecting data used for linear regression and using the selected data instead of all the pieces of work data. As a method of selecting the data, data at the time of charge, data at the time of discharge, or data at the time of work (for example, data at the time of power regeneration when power regeneration or the like is being performed) may be selected. In addition, data at a specific SoC or in a specific SoC range may be selected.

In addition, an OCV curve may be generated based on all the pieces of the work data or the selected data, a slope of the OCV curve may be set as the feature related to the change of the voltage values. OCV refers to an open voltage (a voltage at an output terminal when no element is connected to the output terminal of the rechargeable battery).

Figure 9:
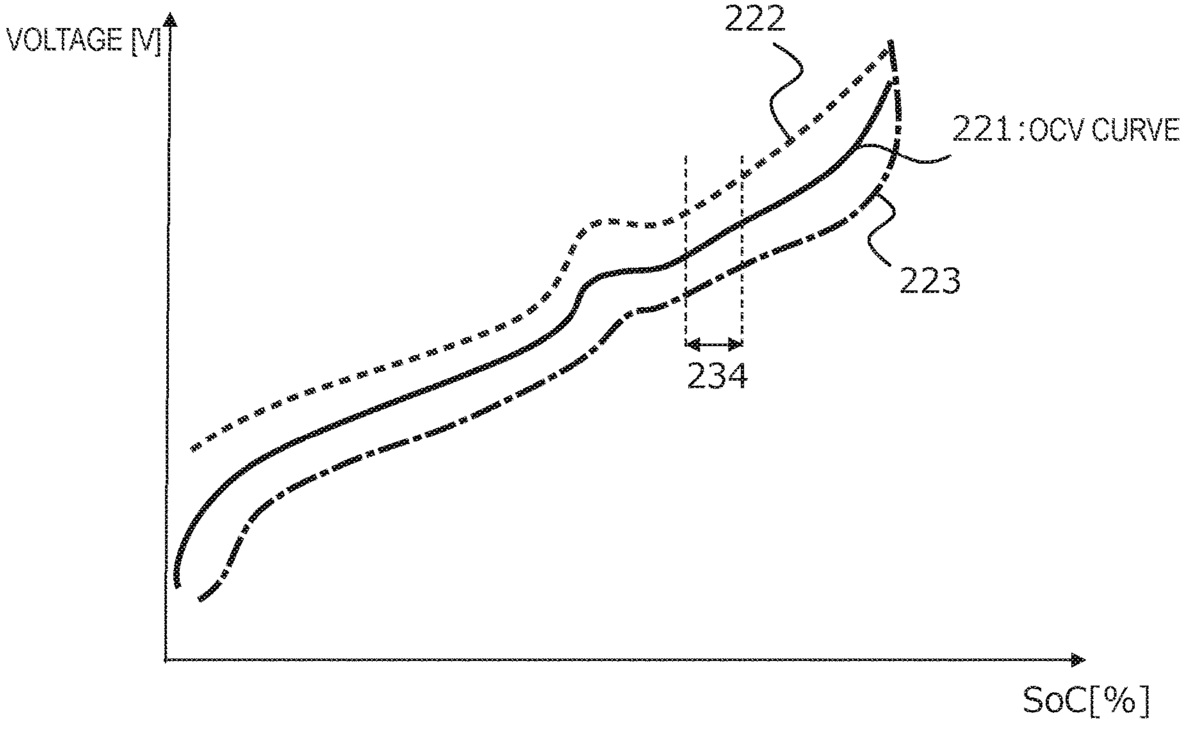
FIG. 9 illustrates an example in which an OCV curve is calculated.

FIG. 9 illustrates an example in which an OCV curve is calculated. An OCV curve 221 indicates a transition of an open voltage with respect to the SoC. A charge curve 222 schematically indicates a set of dots obtained by plotting the charge voltages at the time of charge based on the work data. The charge curve 222 is located above the OCV curve 221. A discharge curve 223 schematically indicates a set of dots obtained by plotting the charge voltages at the time of discharge based on the work data. The discharge curve 223 is located below the OCV curve 221. A slope of a straight line that approximates the entire OCV curve (for example, a straight line that minimizes a squared error with the OCV curve), or a slope of the OCV in the SoC range 234 (for example, a slope of a straight line that approximates a part of the OCV in the range) may be set as a feature. The range of the SoC which is set as a target for calculating the feature is not limited to a range including a plurality of SoCs, but may be a range including a single SoC.

An estimation method of the OCV curve may be any method as long as the estimation method is based on the work data. For example, a line that approximates the dots obtained by plotting the charge voltages at the time of charge and the dots obtained by plotting the discharge voltages at the time of discharge may be calculated, and the calculated line may be set as the OCV curve. Alternatively, (the SoC values and the voltage values) in the work data are sorted in ascending order of the SoC, and a moving average of the voltages is calculated with respect to the SoC based on the sorted data. Data of the moving average of the voltage values with respect to the SoC may be set as estimation data (OCV curve) of the OCV. Alternatively, by using such a property that a relationship between the OCV and the SoC becomes nearly linear depending on a range of the SoC, linear regression is performed in this range, and a regression function is generated. The generated regression function is set as the OCV curve.

Similarly as in the case of the voltage range, a plurality of features related to the voltage change may be calculated. For example, two or three types of data may be selected from data at the time of charge, data at the time of discharge, or data at the time of work (for example, data at the time of power regeneration when power regeneration or the like is performed), and the feature may be calculated for each of the selected types. In addition, a plurality of SoC ranges may be selected, and the feature may be calculated for each of the selected ranges.

The model generator 109 sets each of the calculated features as an explanatory variable, and sets the SoH in the learn data as an objective variable (output variable). For example, when the feature is calculated per day, the feature is calculated per day with regard to each of the rechargeable batteries (the feature is calculated from the work data for 1 day), and the calculated feature is set as the explanatory variable. In addition, the model generator 109 sets the SoH on the same date as that of the work data used for the calculation of the feature as the objective variable.

In the example of FIG. 7, the two features described above are calculated from all the pieces of the work data on 2017 Jan. 1 with regard to the battery 2 to be set as the explanatory variables. The SoH (81.3 in the example of FIG. 7) on 2017 Jan. 1 is set as the objective variable (all the pieces of the work data 2017 Jan. 1 is associated with the same value of the SoH). With regard to the battery 2, the explanatory variables and the objective variable are similarly set for other dates.

The model generator 109 generates a model which estimates the objective variable from the explanatory variables based on the explanatory variables and the objective variable that have been set with regard to the plurality of dates for each of the rechargeable batteries as described above. It is noted that a value of at least some SoH among the SoHs associated with the work data used for the calculation of the feature is different from that of the other SoH, a statistical value such as a mean value, a median value, a maximum value, or a minimum value of the SoHs may be used.

For example, an SoH set as the objective variable is denoted as $O_{SoH}$, a feature related to the voltage range (for example, a standard deviation) set as a first explanatory variable is denoted as Vspread, and a feature related to the voltage change (for example, a voltage slope) set as a second explanatory variable is denoted as Vslope. At this time, the model can be represented by the following expression (1). The model calculates, for example, a state of the rechargeable battery at a target clock time after a certain period of time from a reference clock time. The certain period of time is, for example, 1 week, 1 month, 1 year, or the like. The reference clock time may be a clock time (date) of the work data used for the calculation of the feature. When the work data includes a plurality of dates, the reference clock time may be an earliest date among these dates. Herein, "a", "b", and "c" are coefficients. This model is a linear model, but the model is not limited to be linear. Any learning technique may be used as long as the regression model is generated according to the technique such as linear regression, nonlinear regression, or machine learning (such as a neural net, a random forest, or an SVR).

$$O_{SoH} = a1 * Vspread + b1 * Vslope + c1 \tag{1}$$

When a plurality of features are calculated with regard to each of the voltage range and the voltage change (voltage slope), the model can be represented by the following expression (2). This model is a linear model, but a nonlinear model may also be generated. Herein, "a1", "a2", . . . , "b1", "b2", . . . , "c1" are coefficients.

$$SoH = a1 * Vspread1 + a2 * Vspread2 \ \ldots + b1 * Vslope1 + b2 * Vslope2 \ \ldots + c1 \tag{2}$$

When the plurality of features are used for with regard to each of the voltage range and the voltage change, an optimal feature may be selected with regard to each of the voltage range and the voltage change by a stepwise technique or the like. Alternatively, by a sparse modeling technique or the like, a model including a selection of the explanatory variable may be generated. Specifically, a model including an L1 regularization term, an L2 regularization term, or the like may be generated by LASSO, for example.

In addition, a relationship between the SoH and the voltage range and the voltage change depends on at least one of temperatures of the rechargeable battery and power values at the time of work of the rechargeable battery. The model generator 109 may generate a model by using only the learn data in which each of at least one of the temperatures and the power values is in a certain range.

In addition, the explanatory variable representing the feature related to at least one of the temperatures and the power values may be added to the model. A statistical value such as a mean, a standard deviation, a maximum value, or a minimum value may be calculated as the feature related to the temperatures or the feature related to the power values. The feature may be calculated for each of operation modes of the battery such as the battery in a charge mode, the battery in a discharge mode, and the battery in a work mode. A computed value of the temperatures or the power values between different modes, such as a difference between the temperature in the charge mode and the temperature in the work mode or a difference between the power value in the charge mode and the power value in the work mode, may also be used as the feature.

The charge mode is a mode in which charge is continuously performed for a certain amount of time or more or continuously performed by a certain capacity or more (for example, a case where the rechargeable battery is charged to the upper limit capacity (fully charged)) in an example. The discharge mode is a mode in which discharge is continuously performed for a certain amount of time or more or continuously performed by a certain capacity or more (for example, a case where the rechargeable battery is discharged to the lower limit capacity) in an example. The work mode is a mode in which other operations are performed. For example, the work mode is a mode in which charge and discharge for less than a certain amount of time are repeated. A state in which the regeneration operation is performed may also be set as the work mode.

A model DB 110 stores information of the model generated by the model generator 109 (for example, an expression of the model). Specifically, the information of the model includes information for identifying a type of the model, a value of each coefficient, and a feature represented by each explanatory variable, for example.

The state of health estimator 112 obtains the work data of the rechargeable battery that is set as the evaluation target (target rechargeable battery) from the work DB 101 via the input device 103. In an example, the state of health estimator 112 obtains the work data on a date set as the evaluation target of the rechargeable battery that is set as the evaluation target. The rechargeable battery that is set as the evaluation target may be a rechargeable battery different from the rechargeable battery of the work data used for the generation of the model or may be the same rechargeable battery. In the case of the same rechargeable battery, the work data used for the evaluation of the rechargeable battery is set as data part (second data part) in a period which is different from that of data part (first data part) used for the generation of the model out of the work data. It is noted however that use of the work data in a period that is the same as that of the work data used for the generation of the model is not excluded.

The state of health estimator 112 calculates a feature related to the voltage range (voltage spread) and the feature related to the voltage change (for example, a voltage slope) based on the obtained work data by using the feature calculator 106. The state of health estimator 112 provides the obtained work data to the feature calculator 106.

The voltage range calculator 107 in the feature calculator 106 calculates a feature related to the voltage range based on the work data provided from the state of health estimator 112. The feature to be calculated is the same as the feature used as the explanatory variable in the model to be used. A calculation method of the feature related to the voltage range may be the same as the method described in the explanation on the generation of the model.

The voltage change calculator 108 calculates a feature related to the voltage change based on the work data provided from the state of health estimator 112. A calculation method of the feature related to the voltage range may be the same as the method described in the explanation on the generation of the model.

A decider 111 determines whether all the features to be used as the explanatory variables in the model are calculated by the voltage range calculator 107 and the voltage change calculator 108. When at least one feature (third feature) out of the feature related to the voltage range and the feature related to the voltage change is not calculated, it is decided that an explanatory variable representing the third feature is excluded from the model. Alternatively, it is decided that it is not possible to perform the SoH estimation from the work data of this time. A case where the feature is not calculated is a case where the work data does not meet a condition for the feature calculation. For example, when the feature corresponding to a range in which the SoC is 95% or more and 100% or less needs to be calculated, a case is conceivable that the work data does not include data in the range in which the SoC is 95% or more and 100% or less. In addition, when a certain number of pieces of data is required for the calculation of the feature, a case is conceivable that the number of pieces of data is below the certain number.

The state of health estimator 112 estimates the state of health (SoH) based on the feature calculated by each of the voltage range calculator 107 and the voltage change calculator 108, and the model in the model DB 110. In more detail, the state of health estimator 112 assigns the feature related to the voltage range and the feature related to the voltage change to the relevant explanatory variables in the model to calculate the objective variable of the model. A value of the calculated objective variable represents the estimated SoH of the rechargeable battery.

When a plurality of types of SoHs are included in the learn data and a model is generated for each of the types of the SoHs, the SoH may be estimated for each type.

In CCCV charge/discharge, a current becomes very low in a time slot close to an end of charge or discharge (which is referred to as an end time slot). When such a charge and discharge scheme (first scheme) is used, a resistance deterioration or a decrease in the SoH by the resistance deterioration due to the cycle deterioration or the like is hardly reflected on an SoH (which is denoted by a CCCV_SoH) calculated from data in the end time slot in which the current becomes very low. In view of the above, various types of features are calculated based on the data in the end time slot of the measurement data measured in a first period (for example, an initial stage (at a start of use)) of the rechargeable battery, and the CCCV_SoH is estimated based on the calculated features. Various types of features are calculated based on the data in the end time slot of the measurement data measured in a second period (evaluation target period) of the rechargeable battery, and the CCCV_SoH is estimated based on the calculated features. A difference between the CCCV_SoH corresponding to the first period and the CCCV_SoH corresponding to the second period may be set as a change of the state due to the storage deterioration. That is, the difference may be regarded as the decrease in the SoH due to the storage deterioration. It is noted that when the internal resistance has increased by cycle charge and discharge, the voltage quickly reaches the upper limit voltage at the time of charge, and the voltage quickly reaches the lower limit voltage at the time of discharge. Accordingly, the capacity of the rechargeable battery decreases in effect due to the increase of the internal resistance. That is, not only the internal resistance increases but also the capacity of the rechargeable battery decreases due to the cycle deterioration. The end time slot may be specified in an amount of time or may also be specified in an SoC range.

In addition, a difference between the SoH calculated based on the measurement data charged and discharged by another scheme (second scheme) other than the CCCV and the SoH (CCCV_SoH) calculated based on the data in the end time slot of the measurement data charged and discharged by the first scheme may be calculated, and the calculated difference may be set as a change of the state due to the cycle deterioration. For example, various types of features are calculated based on the data in the end time slot of the measurement data at the time of charge and discharge by the first scheme in the first period of the rechargeable battery, and the CCCV_SoH is estimated based on the calculated features. Various types of features are calculated based on the measurement data at the time of charge and discharge by the second scheme in the second period (evaluation target period) of the rechargeable battery, and the SoH is estimated based on the calculated features. A difference between the CCCV_SoH corresponding to the first period and the SoH corresponding to the second period may be regarded as a change of the state due to the progress of the cycle deterioration (the increase of the internal resistance). That is, the difference may be regarded as the decrease in the SoH due to the cycle deterioration (the increase of the internal resistance). In an example, the second scheme is one of constant power charge, constant power discharge, constant current charge, constant current discharge, constant voltage charge, and constant voltage discharge.

An output DB 113 stores information indicating the SoH estimated by the state of health estimator 112 in association with an ID for identifying the rechargeable battery that is set as the evaluation target. By setting the plurality of rechargeable batteries as the evaluation targets and performing the SoH estimation on each of the rechargeable batteries with regard to a plurality of dates, a history of estimation results of the SoH is stored for each of the rechargeable batteries.

An output device 114 outputs information of the SoH related to the rechargeable battery based on the information stored in the output DB 113. The output device 114 is a display device configured to display the information on a screen, a transmission device configured to transmit information to another device in a wired or wireless manner, or the like. Another device that is set as a destination of the information may be a terminal device held by a user such as an administrator of the rechargeable battery that is set as the evaluation target, may be a server configured to remotely monitor the rechargeable battery that is set as the evaluation target, or may be a device to which the rechargeable battery that is set as the evaluation target is mounted.

Figure 10:
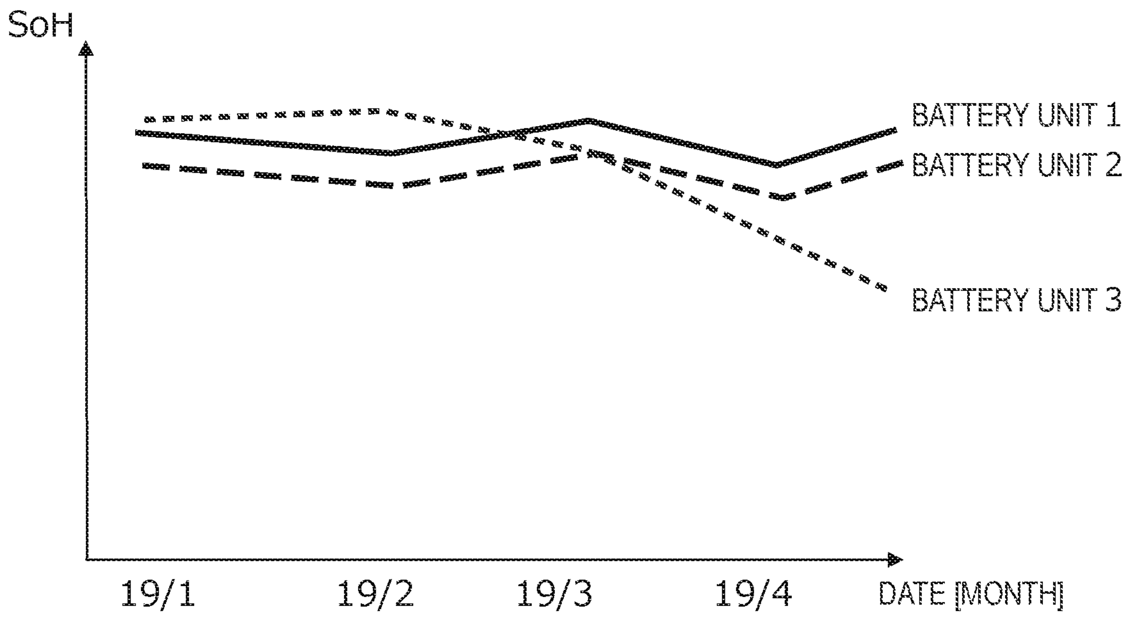
FIG. 10 illustrates an example of an estimation result of the SoH.

FIG. 10 illustrates an example of estimation results of the SoH. In this example, each of the battery units 1 to 3 in a certain storage system is used as the rechargeable battery that is set as the evaluation target, and a history of the results obtained by estimating the SoH per month is illustrated. Data is illustrated with regard to transitions of the estimated values in time series of the SoHs of the battery units 1 to 3.

A horizontal axis represents a date (month) set as the evaluation target, and a vertical axis represents an SoH. Herein, "19/1" means January 2019. The horizontal axis may represent electric energy, an equivalent cycle count, or the like instead of the date. The equivalent cycle count is a value obtained by dividing a total amount of electric power by which the rechargeable battery has been charged and discharged so far by a rated value of the battery capacity.

Figure 11:
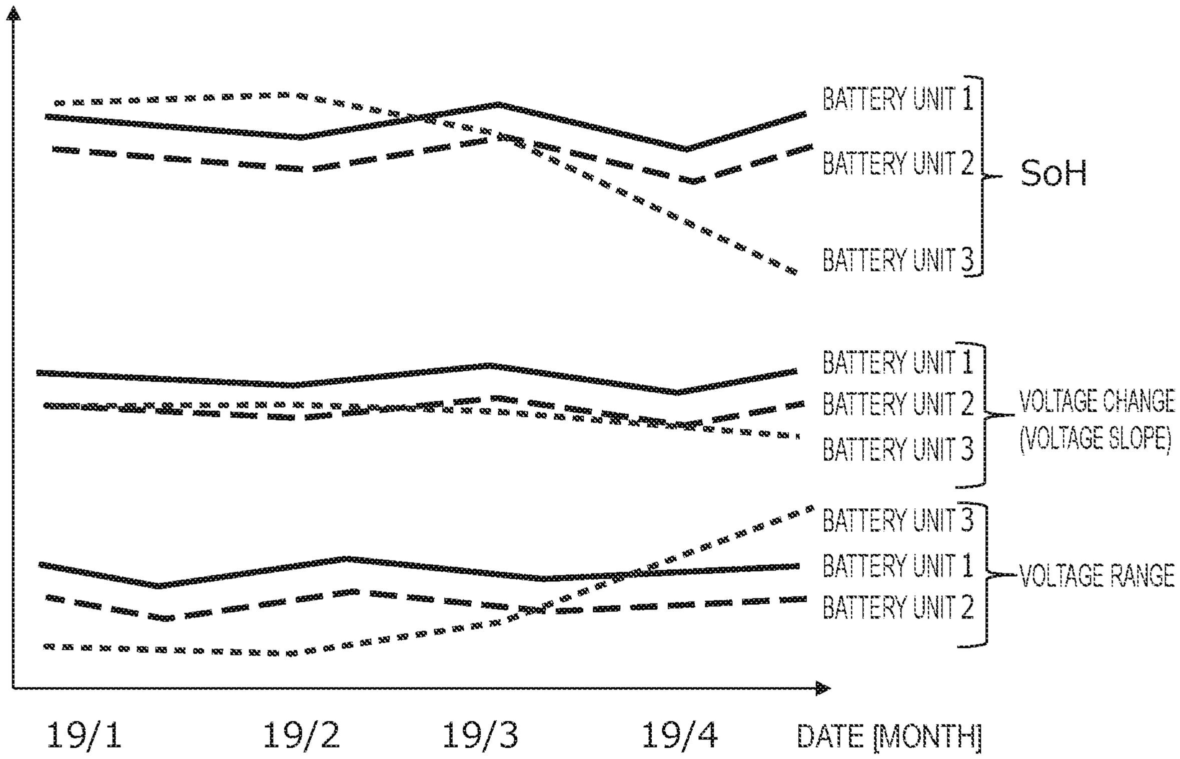
FIG. 11 illustrates an example in which transitions of the feature related to the voltage distribution and a feature related to a voltage slope are displayed at the same time.

FIG. 11 illustrates an example in which in addition to the estimated SoH, transitions of the voltage range (herein, a standard deviation) and the voltage change (herein, a voltage slope) as the features are also displayed at the same time. By outputting data of the feature related to the voltage range and data of the feature related to the voltage change at the same time, a type of the deterioration in progress can also be confirmed. For example, in a case where the feature related to the voltage range (standard deviation) increases, it is possible to confirm that the cycle deterioration has progressed. In a case where the feature related to the voltage change (voltage slope) increases, it is possible to confirm that the storage deterioration has progressed. In the example of FIG. 11, the SoH of the battery unit 3 decreases, and also the feature related to the voltage range (standard deviation) increases. The voltage slope gradually decreases. Thus, it is possible to determine that the cycle deterioration has progressed in the battery unit 3.

Figure 12:
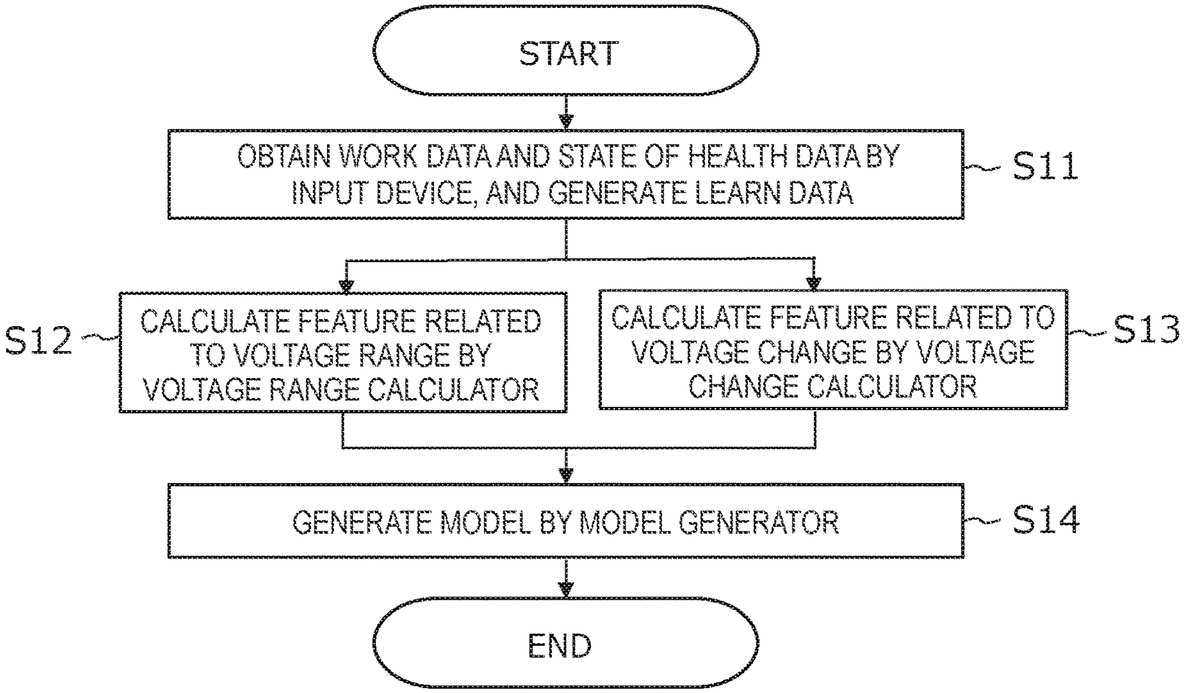
FIG. 12 is a flowchart illustrating an example of an operation in a learn mode in the rechargeable battery evaluation apparatus according to the present embodiment.

FIG. 12 is a flowchart illustrating an example of an operation in a learn mode in the rechargeable battery evaluation apparatus according to the present embodiment.

In step S11, the input device 103 obtains work data of a plurality of the rechargeable batteries from the work DB 101 and obtains state of health data of the plurality of rechargeable batteries from the state of health DB 102 to provide the work data and the state of health data to the data registration device 104. The data registration device 104 associates the state of health data with the work data to generate learn data, and stores the learn data in the learn DB 105.

In step S12, the voltage range calculator 107 calculates one or a plurality of features related to the voltage range based on the work data of the learn data in the learn DB 105 under control of the model generator 109.

In step S13, the voltage change calculator 108 calculates one or a plurality of features related to the voltage change based on the work data of the learn data in the learn DB 105 under the control of the model generator 109.

In step S14, the model generator 109 generates an estimation model of the SoH based on the feature related to the voltage range, the feature related to the voltage change, and the state of health data in the learn data. In more detail, the model is generated in which each of the feature related to the voltage range and the feature related to the voltage change is set as an explanatory variable (input variable) and the SoH is set as an objective variable (output variable). The model generator 109 stores the generated model in the model DB 110.

Figure 13:
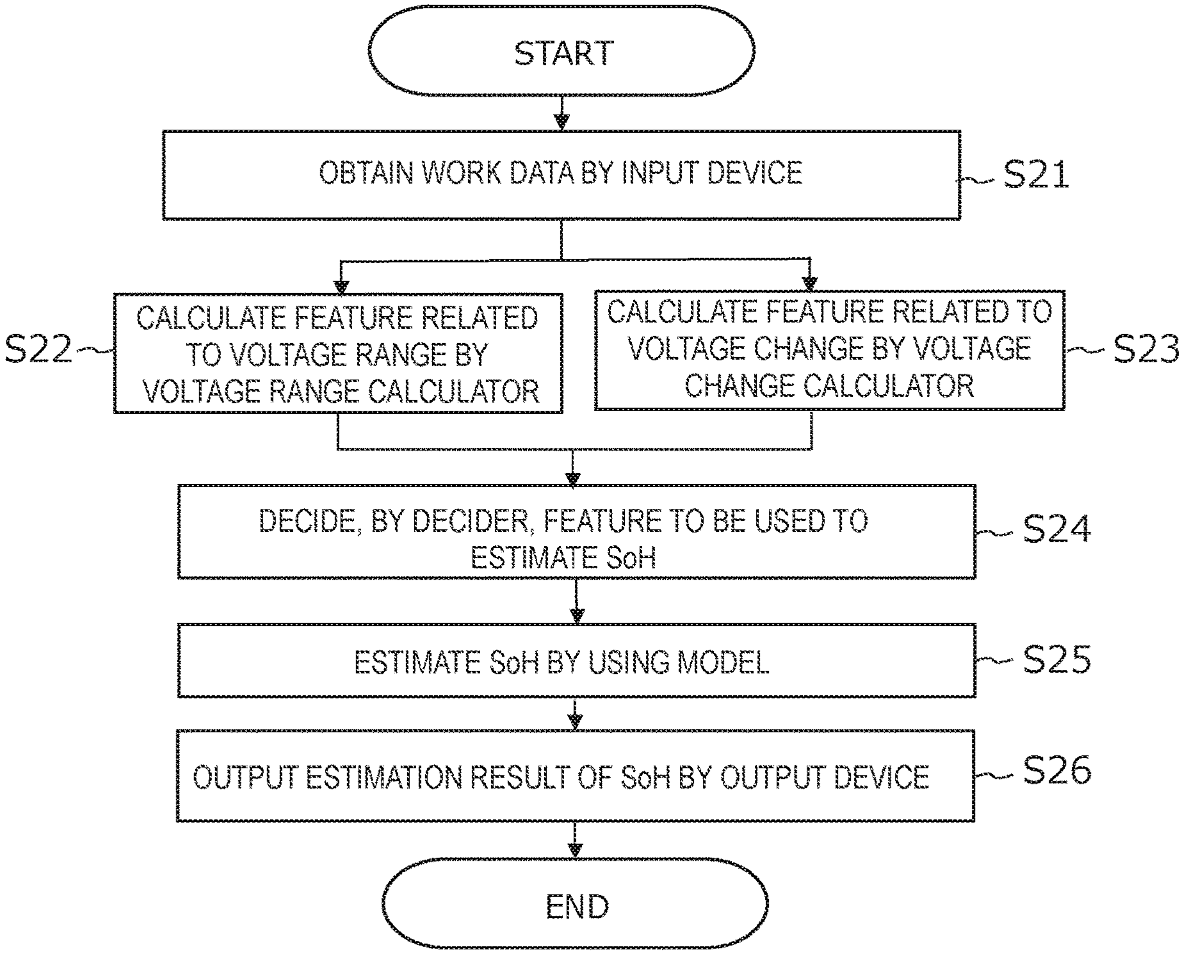
FIG. 13 is a flowchart illustrating an example of an operation in an estimation mode in the rechargeable battery evaluation apparatus according to the present embodiment.

FIG. 13 is a flowchart illustrating an example of an operation in an estimation mode in the rechargeable battery evaluation apparatus 100 according to the present embodiment.

In step S21, the input device 103 obtains work data of the rechargeable battery that is set as the evaluation target from the work DB 101, and provides the work data to the state of health estimator 112. The rechargeable battery that is set as the evaluation target may be a single rechargeable battery or may be a plurality of rechargeable batteries.

In step S22, the voltage range calculator 107 calculates one or a plurality of features related to the voltage range based on the work data of the rechargeable battery that is set as the evaluation target under control of the state of health estimator 112. Types of the features to be calculated may be the same as those of the features related to the voltage range used as the input variables in the model.

In step S23, the voltage change calculator 108 calculates one or a plurality of features related to the voltage change based on the work data of the rechargeable battery that is set as the evaluation target under the control of the state of health estimator 112. Types of the features to be calculated may be the same as those of the features related to the voltage change used as the input variables in the model.

In step S24, the decider 111 determines whether all of the features used as the input variables in the model are calculated in step S22 and step S23. When at least some of the features is not calculated due to a lack of the work data or the like, a term including a feature that is not calculated may be deleted from the model. Accordingly, the estimation of the SoH may be allowed to be performed without using the feature that is not calculated. Alternatively, when at least some feature is not calculated, it may be determined that it is not possible to perform the estimation of the SoH this time, and the present processing may be ended. Alternatively, the deletion of the term including the feature or the determination that it is not possible to perform the estimation of the SoH may be switched depending on a type of the feature that is not calculated.

In step S25, the state of health estimator 112 estimates the SoH of the rechargeable battery that is set as the evaluation target based on the features calculated in step S22 and step S23 and the model in the model DB 110. In more detail, the features calculated in step S22 and step S23 are assigned to the explanatory variables of the model to calculate the objective variable of the model. The state of health estimator 112 stores a value of the calculated objective variable, that is, an estimated SoH in the output DB 113. By performing the estimation of the SoH at regular timing (for example, every hour, every day, every week, every month, or the like) in the work data, the value of the SoH that has been estimated at regular timing may be stored in the output DB 113 as an estimation history of the SoH.

In step S26, the output device 114 outputs the estimated value of the SoH in the output DB 113. For example, the output device 114 displays the estimated value of the SoH on a screen together with information of the rechargeable battery that is set as the evaluation target. The output device 114 may display a graph indicating the estimated value of the SoH on the screen for each of one or a plurality of rechargeable batteries. The output device 114 may also display a graph indicating the transition of the feature related to the voltage range and a graph indicating the transition of the feature related to the voltage change on the screen for each of one or a plurality of rechargeable batteries.

The operation in the estimation mode illustrated in FIG. 13 may be performed after the learn mode illustrated in FIG. 12, or the operations in both modes may be performed concurrently. It is noted however that the operation in the learn mode needs to be completed before step S24 or step S25.

As described above, according to the present embodiment, both the feature related to the voltage range and the feature related to the voltage change are calculated based on the work data obtained from the currently working rechargeable battery to estimate the SoH. Accordingly, without stopping the work of the rechargeable battery and also irrespective of the type of the deterioration in progress in the rechargeable battery, the highly accurate SoH estimation can be performed. That is, properties of both the capacity decrease due to the storage deterioration and the capacity decrease (and the increase of the internal resistance) due to the cycle deterioration or the like can be taken into account. The highly accurate SoH estimation without depending on the deterioration condition of the rechargeable battery can be realized. The present effects will be described in detail as follows.

According to the technique of International Publication No. WO 2021/044635 that has been described in the background section, since the SoH of the rechargeable battery is measured from data obtained by performing charge and discharge in a special manner on the rechargeable battery, the work of the rechargeable battery has to stop.

On the other hand, according to the technique of Japanese Patent No. 6313502 that has been described in the background section, since the SoH of the rechargeable battery is measured from the data at the time of normal work of the rechargeable battery, the rechargeable battery does not need to stop. According to this technique, the distribution (spread) of the voltage during work is quantified to calculate the SoH. The SoH based on the increased amount in the internal resistance is estimated according to this technique since a degree of the voltage distribution (degree of the spread) is attributable to the increase of the internal resistance of the battery. The technique of Japanese Patent No. 6313502 is a technique appropriate for the estimation of the deterioration state having a correlation between the increase of the internal resistance and the SoH as in the cycle deterioration. However, in a case where the storage deterioration has progressed or the like, a large decrease in the capacity occurs due to a potential deviation or the like. Accordingly, the correlation between the increase of the internal resistance and the SoH may breaks down. In such a case, an error occurs in the estimation of the SoH.

According to the technique of Japanese Patent Laid-Open No. 2020-119712, a simulated open circuit voltage (OCV) is generated from the work data obtained at the time of work of the rechargeable battery, and the SoH is quantitatively evaluated based on the transition of the OCV from an initial stage of the rechargeable battery (beginning of its use). Since an influence of the potential deviation (storage deterioration) is reflected on the evaluation, this technique is a technique appropriate to a case where the storage deterioration mainly occurs. However, it is not possible to reflect the deterioration due to the increase of the internal resistance.

Depending on an intended use of the rechargeable battery, both the cycle deterioration and the storage deterioration may occur. For example, when the rechargeable battery is used for suppression of the frequency fluctuation in the electric power system and is thereafter used for power supply by way of reuse, both the cycle deterioration and the storage deterioration may occur. Therefore, the SoH needs to be estimated without depending on the deterioration condition of the rechargeable battery, that is, the SoH needs to be estimated by taking into account the decrease in the capacity due to both the storage deterioration and the cycle deterioration.

According to the present embodiment, by estimating the SoH based on the feature related to the voltage change that has a correlation with the decrease in the capacity due to the storage deterioration and the feature related to the voltage range that has a correlation with the increase of the internal resistance (decrease in the capacity in effect) due to the cycle deterioration or the like, both the deteriorations can be taken into account, and the highly accurate estimation can be realized.

Hardware Configuration

Figure 14:
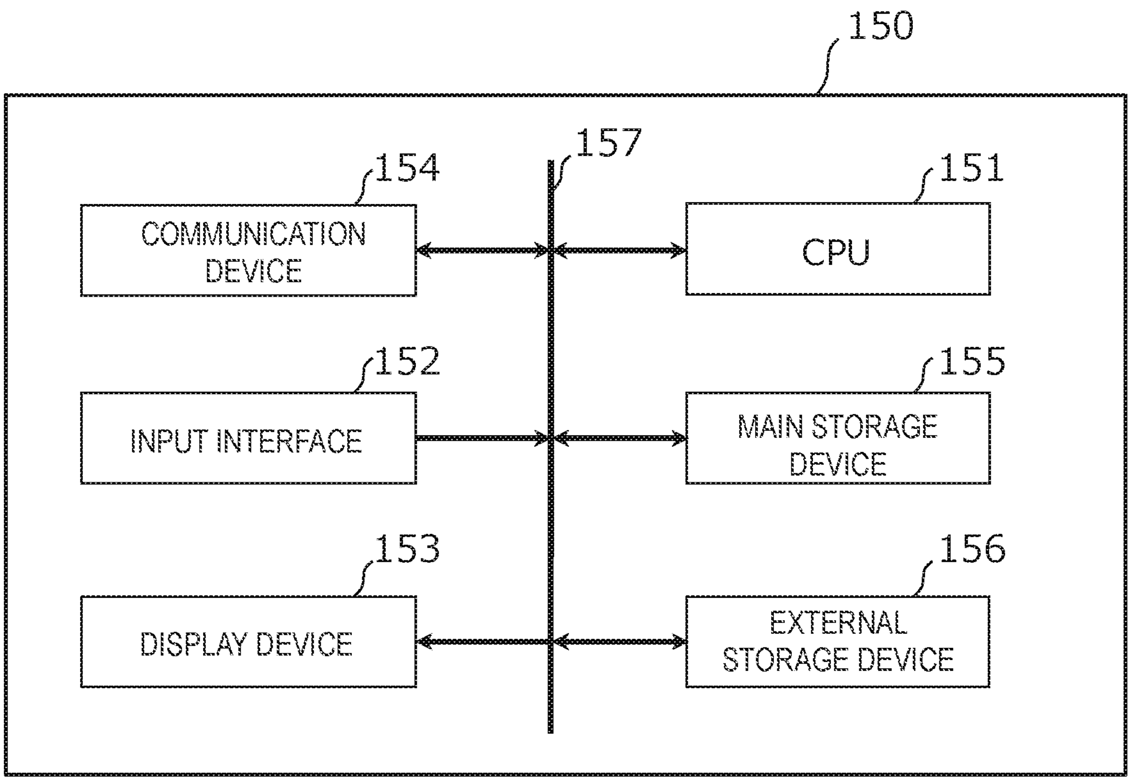
FIG. 14 illustrates a hardware configuration example of the rechargeable battery evaluation apparatus according to an embodiment of the present invention.

FIG. 14 illustrates a hardware configuration example of the rechargeable battery evaluation apparatus 100 according to an embodiment of the present invention. This hardware configuration can be used for the rechargeable battery evaluation apparatus 100 according to each of the embodiments described above. The hardware configuration of FIG. 14 is configured as a computer 150. The computer 150 includes a CPU 151, an input interface 152, a display device 153, a communication device 154, a main storage device 155, and an external storage device 156, which are connected by a bus 157 so as to be mutually communicable.

The input interface 152 obtains the measurement data of the rechargeable battery via wiring or the like. The input interface 152 may be an operator used by a user to provide an instruction to this apparatus. Examples of the operator include a keyboard, a mouse, and a touch panel. The communication device 154 includes a wireless or wired communicator, and performs wired or wireless communication with an EV 200. The measurement data may be obtained via the communication device 154.

The input interface 152 and the communication device 154 may be respectively configured by separate circuits such as integrated circuits or may be configured by a single circuit such as an integrated circuit. The display device 153 is, for example, a liquid crystal display device, an organic EL display device, a CRT display device, or the like. The display device 153 corresponds to the output device 114 in FIG. 1.

The external storage device 156 includes, for example, a storage medium such as an HDD, an SSD, a memory device, a CD-R, a CD-RW, a DVD-RAM, or a DVD-R. The external storage device 156 stores a program for causing the CPU 151 functioning as a processor to execute a function of each of processing devices of the rechargeable battery evaluation apparatus 100. In addition, each of the DBs included in the rechargeable battery evaluation apparatus 100 is also included in the external storage device 156. Herein, only the single external storage device 156 is illustrated, but a plurality of external storage devices 156 may be present.

The main storage device 155 expands a control program stored in the external storage device 156 under control by the CPU 151, and stores data required at the time of execution of the program, data generated by the execution of the program, and the like. The main storage device 155 includes any memory or storage such as, for example, a volatile memory (such as a DRAM or an SRAM) or a nonvolatile memory (such as a NAND flash memory or an MRAM). When the control program expanded in the main storage device 155 is executed by the CPU 151, the function of each of the processing devices of the rechargeable battery evaluation apparatus 100 is executed. Each of the DBs included in the rechargeable battery evaluation apparatus 100 may also be included in the main storage device 155.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An information processing apparatus comprising:
processing circuitry configured to acquire measurement data including a plurality of amounts of charge and a plurality of voltage values in a target rechargeable battery;
calculate, based on the measurement data, a first feature related to a range of the voltage values with respect to the amounts of charge and a second feature related to a change of the voltage values with respect to the amounts of charge; and
estimate a state of the target rechargeable battery based on the first feature and the second feature,
wherein
the measurement data includes first measurement data measured when charging or discharging is performed based on a first scheme in which a current becomes relatively small in an end time slot close to an end of the charging or discharging, and a second measurement data measured when the charging or discharging is performed based on a second scheme different from the first scheme,
the processing circuitry calculates the first feature and the second feature based on data of the end time slot in the first measurement data, and estimates the state of the target rechargeable battery based on the first feature and the second feature that have been calculated,
the processing circuitry calculates the first feature and the second feature based on the second measurement data, and estimates the state of the target rechargeable battery based on the first feature and the second feature that have been calculated, and
a difference between an estimated value of the state of the target rechargeable battery based on the second scheme and an estimated value of the state of the target rechargeable battery based on the first scheme is calculated, and a change of the state due to a cycle deterioration of the target rechargeable battery is calculated based on the calculated difference.

2. The information processing apparatus according to claim 1,
wherein the first feature includes a standard deviation of the voltage values included in a first charge amount range in the measurement data.

3. The information processing apparatus according to claim 1,
wherein the plurality of voltage values represent charge voltage values or discharge voltage values, and
the processing circuitry obtains the charge voltage values and the discharge voltage values in a second charge amount range based on the measurement data to calculate a difference between a first voltage value based on the charge voltage values and a second voltage value based on the discharge voltage values, and the difference is the first feature.

4. The information processing apparatus according to claim 1,
wherein the processing circuitry generates an OCV curve based on the measurement data, and a slope of the OCV curve is set as the second feature.

5. The information processing apparatus according to claim 1,
wherein the processing circuitry generates a regression function for regressing the voltage values by the amounts of charge based on the measurement data, and a slope of the regression function is set as the second feature.

6. The information processing apparatus according to claim 1,
wherein the measurement data further includes clock times,
the processing circuitry is further configured to generate, based on the measurement data of a plurality of rechargeable batteries and state data including states of the plurality of rechargeable batteries and clock times, an estimation model in which the first feature and the second feature are set as input variables, and the states of the rechargeable batteries are set as output variables, and
the processing circuitry estimates the state of the target rechargeable battery based on the estimation model.

7. The information processing apparatus according to claim 6,
wherein the processing circuitry calculates at least one first feature and at least one second feature, and
when the measurement data does not meet a condition for calculating a third feature that is at least one feature of the first feature and the second feature, the processing circuitry eliminates an input variable corresponding to the third feature from the estimation model.

8. The information processing apparatus according to claim 7,
wherein the condition is that a number of data pieces of the measurement data is more than or equal to a number of data pieces required to calculate the third feature.

9. The information processing apparatus according to claim 6,
wherein the processing circuitry estimates states of the target rechargeable battery at a plurality of target clock times, and
the information processing apparatus further comprises an output device configured to output data indicating a transition of the states that have been estimated for the target rechargeable battery.

10. The information processing apparatus according to claim 9,
wherein the output device further outputs data indicating a transition of the first feature used for estimating the states of the target rechargeable battery and data indicating a transition of the second feature used for estimating the states of the target rechargeable battery.

11. The information processing apparatus according to claim 1,
wherein the measurement data is data measured when charge or discharge is performed based on a first scheme in which a current becomes relatively small in an end time slot close to an end of charge or discharge,
the processing circuitry calculates the first feature and the second feature based on data of the end time slot in the measurement data in a first period, and the processing circuitry estimates the state of the target rechargeable battery corresponding to the first period based on the first feature and the second feature that have been calculated,
the processing circuitry calculates the first feature and the second feature based on data of the end time slot in the measurement data in a second period, and the processing circuitry estimates the state of the target rechargeable battery corresponding to the second period based on the first feature and the second feature that have been calculated, and a change of the state due to a storage deterioration of the target rechargeable battery is calculated based on a difference between an estimated value of the state of the target rechargeable battery corresponding to the first period and an estimated value of the state of the target rechargeable battery corresponding to the second period.

12. The information processing apparatus according to claim 1, wherein the first scheme is constant current-constant voltage charging, and the second scheme is one of constant power charging, constant power discharging, constant current charging, constant current discharging, constant voltage charging, and constant voltage discharging.

13. The information processing apparatus according to claim 6, wherein the plurality of rechargeable batteries include the target rechargeable battery, and the processing circuitry uses a first data part of the target rechargeable battery to generate the estimation model, and uses a second data part that is different form the first data part to estimate the state of the target rechargeable battery.

14. The information processing apparatus according to claim 1, wherein the state of the target rechargeable battery is an SoH of the target rechargeable battery.

15. The information processing apparatus according to claim 14, wherein the SoH is a ratio of a battery capacity of the target rechargeable battery to a reference battery capacity of the target rechargeable battery.

16. The information processing apparatus according to claim 14, wherein the SoH is an internal resistance value of the target rechargeable battery.

17. An information processing method comprising:

acquiring measurement data including a plurality of amounts of charge and a plurality of voltage values in a target rechargeable battery;

calculating, based on the measurement data, a first feature related to a range of the voltage values with respect to the amounts of charge and a second feature related to a change of the voltage values with respect to the amounts of charge; and estimating a state of the target rechargeable battery based on the first feature and the second feature, wherein the measurement data includes first measurement data measured when charging or discharging is performed based on a first scheme in which a current becomes relatively small in an end time slot close to an end of the charging or discharging, and a second measurement data measured when the charging or discharging is performed based on a second scheme different from the first scheme, calculating the first feature and the second feature based on data of the end time slot in the first measurement data, and estimating the state of the target rechargeable battery based on the first feature and the second feature that have been calculated, calculating the first feature and the second feature based on the second measurement data, and estimating the state of the target rechargeable battery based on the first feature and the second feature that have been calculated, and calculating a difference between an estimated value of the state of the target rechargeable battery based on the second scheme and an estimated value of the state of the target rechargeable battery based on the first scheme, and calculating a change of the state due to a cycle deterioration of the target rechargeable battery based on the calculated difference.

18. A non-transitory computer readable medium having a computer program stored therein which causes a computer to perform processes comprising:

acquiring measurement data including a plurality of amounts of charge and a plurality of voltage values in a target rechargeable battery;

calculating, based on the measurement data, a first feature related to a range of the voltage values with respect to the amounts of charge and a second feature related to a change of the voltage values with respect to the amounts of charge; and estimating a state of the target rechargeable battery based on the first feature and the second feature, wherein the measurement data includes first measurement data measured when charging or discharging is performed based on a first scheme in which a current becomes relatively small in an end time slot close to an end of the charging or discharging, and a second measurement data measured when the charging or discharging is performed based on a second scheme different from the first scheme, calculating the first feature and the second feature based on data of the end time slot in the first measurement data, and estimating the state of the target rechargeable battery based on the first feature and the second feature that have been calculated, calculating the first feature and the second feature based on the second measurement data, and estimating the state of the target rechargeable battery based on the first feature and the second feature that have been calculated, and calculating a difference between an estimated value of the state of the target rechargeable battery based on the second scheme and an estimated value of the state of the target rechargeable battery based on the first scheme, and calculating a change of the state due to a cycle deterioration of the target rechargeable battery based on the calculated difference.

19. An information processing system comprising:

a rechargeable battery; and processing circuitry configured to acquire measurement data including a plurality of amounts of charge and a plurality of voltage values in the rechargeable battery;

calculate, based on the measurement data, a first feature related to a range of the voltage values with respect to the amounts of charge and a second feature related to a change of the voltage values with respect to the amounts of charge; and estimate a state of the rechargeable battery based on the first feature and the second feature, wherein the measurement data includes first measurement data measured when charging or discharging is performed based on a first scheme in which a current becomes relatively small in an end time slot close to an end of the charging or discharging, and a second measurement data measured when the charging or discharging is performed based on a second scheme different from the first scheme, the processing circuitry calculates the first feature and the second feature based on data of the end time slot in the first measurement data, and estimates the state of the rechargeable battery based on the first feature and the second feature that have been calculated, the processing circuitry calculates the first feature and the second feature based on the second measurement data, and estimates the state of the rechargeable battery based on the first feature and the second feature that have been calculated, and a difference between an estimated value of the state of the rechargeable battery based on the second scheme and an estimated value of the state of the rechargeable battery based on the first scheme is calculated, and a change of the state due to a cycle deterioration of the rechargeable battery is calculated based on the calculated difference.

* * * * *